US012747496B2

(12) United States Patent
Goto et al.

(10) Patent No.: US 12,747,496 B2
(45) Date of Patent: Sep. 29, 2026

(54) FILM FORMING METHOD AND FILM FORMING APPARATUS

(71) Applicant: Tokyo Electron Limited, Tokyo (JP)

(72) Inventors: Kazuki Goto, Nirasaki City (JP); Yoshihiro Kato, Nirasaki City (JP); Junya Suzuki, Nirasaki City (JP); Yuji Otsuki, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 84 days.

(21) Appl. No.: 18/232,926

(22) Filed: Aug. 11, 2023

(65) Prior Publication Data

US 2024/0052483 A1 Feb. 15, 2024

(30) Foreign Application Priority Data

Aug. 12, 2022 (JP) ................................ 2022-128580

(51) Int. Cl.
*C23C 16/32* (2006.01)
*C23C 16/455* (2006.01)

(52) U.S. Cl.
CPC ........ *C23C 16/32* (2013.01); *C23C 16/45553* (2013.01)

(58) Field of Classification Search
CPC ... C23C 16/32; C23C 16/45553; C23C 16/56; C23C 16/325; H01L 21/0228; H01L 21/02123; H01L 21/02205; H01L 21/30604
See application file for complete search history.

(56) References Cited

U.S. PATENT DOCUMENTS

2013/0244446 A1* 9/2013 Tsuji .................. H01L 21/0228 438/778
2020/0263295 A1* 8/2020 Miyahara ............ H01L 21/0262
2020/0395211 A1* 12/2020 Jia ..................... H01L 21/02208
(Continued)

FOREIGN PATENT DOCUMENTS

JP 2015159212 A 9/2015
JP 2017022276 A 1/2017
(Continued)

*Primary Examiner* — Dah-Wei D. Yuan
*Assistant Examiner* — Nga Leung V Law
(74) *Attorney, Agent, or Firm* — Nath, Goldberg & Meyer; Jerald L. Meyer; Tanya E. Harkins

(57) ABSTRACT

A method of forming a SiOC-based film includes: preparing a substrate; forming a SiC-based film on the substrate by using a carbon precursor made of a carbon-containing gas and a silicon precursor made of a silicon-containing gas; forming the SiOC-based film by performing oxidation process on the SiC-based film on the substrate; and performing a processing with plasma of a gas containing a $H_2$ gas on the SiOC-based film on the substrate, wherein the forming the SiC-based film is performed before the SiC-based film has a first given film thickness, the forming the SiC-based film and the forming the SiOC-based film by the oxidation process are executed once or multiple times before the SiOC-based film has a second given film thickness, and an operation of forming the SiOC-based film to have the second given film thickness and the performing the processing with the plasma are executed once or multiple times.

15 Claims, 14 Drawing Sheets

(56) References Cited

U.S. PATENT DOCUMENTS

| | | | | |
|---|---|---|---|---|
| 2022/0367205 | A1* | 11/2022 | Prasad | H01L 21/76825 |
| 2023/0009077 | A1* | 1/2023 | Liang | H10D 62/118 |
| 2023/0215724 | A1* | 7/2023 | Nishida | H01L 21/02238 438/770 |

FOREIGN PATENT DOCUMENTS

| | | | | | |
|---|---|---|---|---|---|
| JP | 2020150206 | A | | 9/2020 | |
| JP | 2021-158133 | A | | 10/2021 | |
| JP | 2022-065560 | A | | 4/2022 | |
| JP | 2022-067559 | A | | 5/2022 | |
| TW | 202113132 | A | * | 4/2021 | C07F 7/10 |
| WO | WO-2022064586 | A1 | * | 3/2022 | C23C 16/24 |

* cited by examiner

FILM FORMING METHOD AND FILM FORMING APPARATUS

CROSS-REFERENCE TO RELATED APPLICATION

This application is based upon and claims the benefit of priority from Japanese Patent Application No. 2022-128580, filed on Aug. 12, 2022, the entire contents of which are incorporated herein by reference.

TECHNICAL FIELD

The present disclosure relates to a film forming method and a film forming apparatus.

BACKGROUND

Silicon-containing films are frequently used in semiconductor devices. Patent Document 1 discloses a method of forming a SiC-containing film on a substrate as a silicon-containing film suitable for a hard mask by using a carbon precursor gas containing an organic compound having an unsaturated carbon bond and a silicon precursor gas containing a silicon compound.

On the other hand, SiOC films are known as insulative silicon-containing films having a low dielectric constant (k-value) and high etching resistance (chemical treatment resistance). Patent Document 2 discloses a method of forming a SiOC film with high controllability of the concentration of C by repeatedly performing a process of forming a first film containing Si, O, and C by using a silicon compound having a Si—O bond as a raw material gas, and a process of forming a second film containing Si and C by using a carbon-containing precursor and a silicon-containing precursor.

PRIOR ART DOCUMENTS

Patent Documents

Patent Document 1: Japanese Patent Laid-Open Publication No. 2021-158133

Patent Document 2: Japanese Patent Laid-Open Publication No. 2022-067559

SUMMARY

According to one embodiment of the present disclosure, there is provided a film forming method of forming a SiOC-based film, which includes: preparing a substrate; forming a SiC-based film on the substrate by using a carbon precursor made of a carbon-containing gas and a silicon precursor made of a silicon-containing gas; forming the SiOC-based film by performing an oxidation process on the SiC-based film on the substrate; and performing a processing with plasma of a gas containing a $H_2$ gas on the SiOC-based film on the substrate, wherein the forming the SiC-based film is performed before the SiC-based film has a first given film thickness, the forming the SiC-based film and the forming the SiOC-based film by the oxidation process are executed once or multiple times before the SiOC-based film has a second given film thickness, and an operation of forming the SiOC-based film to have the second given film thickness and the performing the processing with the plasma are executed once or multiple times.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments will be described in detail with reference to the accompanying figures. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Method>

Figure 1:
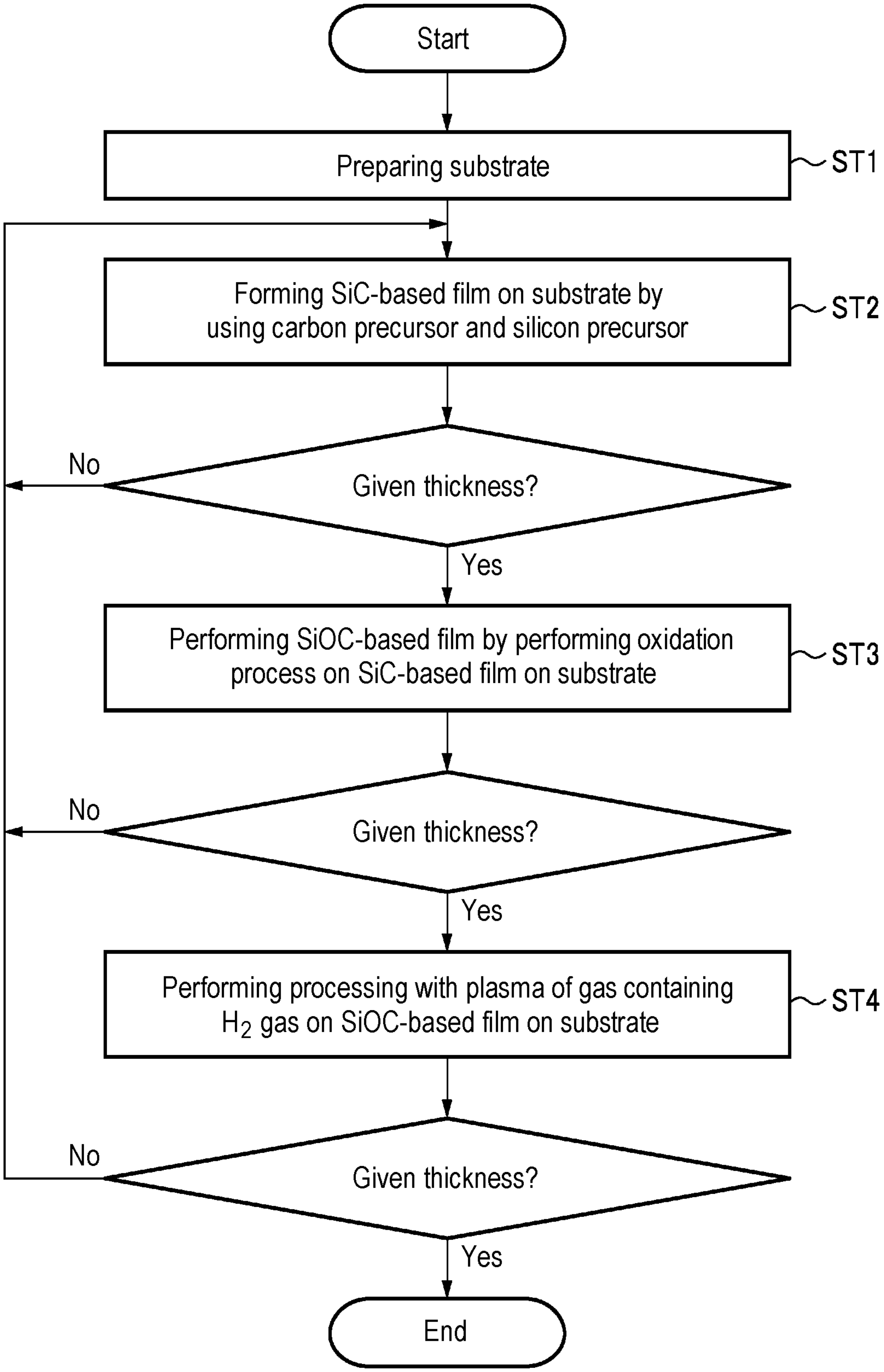
FIG. 1 is a flowchart illustrating an example of a film forming method according to an embodiment.

FIG. 1 is a flowchart illustrating an example of a film forming method according to an embodiment. The film forming method of an embodiment includes: preparing a substrate (step ST1); forming a SiC-based film on the substrate by using a carbon precursor and a silicon precursor (step ST2); performing an oxidation process on the SiC-based film formed on the substrate to form a SiOC-based film (step ST3); and performing processing on the SiOC-based film on the substrate with plasma of a gas containing a $H_2$ gas (step ST4).

As illustrated in FIG. 1, the formation of the SiC-based film in step ST2 is performed before the SiC-based film has a first given film thickness. Step ST2 and the formation of the SiOC-based film by the oxidation process in step ST3 are performed once or multiple times before the SiOC-based film has a second given film thickness. Thereafter, the SiOC-based film thus formed is subjected to the $H_2$-based plasma process in step ST4 to modify the SiOC-based film. An operation of forming the SiOC-based film before the SiOC-film has the second given film thickness (the operation of performing steps ST2 and ST3 once or multiple times) and the $H_2$-based plasma process in step ST4 are repeated before the modified SiOC-based film has a third given film thickness.

In step ST1, the substrate is not particularly limited, but may include a semiconductor substrate (semiconductor wafer) such as a silicon substrate or the like.

In step ST2, the SiC-based film is formed by causing the carbon precursor and the silicon precursor to react with each other on the substrate. The SiC-based film may contain impurities and additives in addition to SiC.

The carbon precursor is made of a carbon-containing gas. An organic compound gas may be used as the carbon-containing gas. As the organic compound gas used as the carbon-containing gas, one having an unsaturated carbon bond, that is, one having a double bond or triple bond between carbon atoms may be used. The organic compound having an unsaturated carbon bond has high reactivity, making it possible to form a SiC-based film at a lower temperature. Examples of the organic compound having an unsaturated bond may include compounds having a skeleton that is an unsaturated carbon bonding portion and a side chain that is bonded to the skeleton. Examples of the side chain may include a hydrogen atom, a halogen, an alkyl group having 5 or less carbon atoms, a carbon double bond or triple bond, a group in which a site bonded to a carbon of the skeleton is Si, C, N, or O, and the like. The unsaturated carbon bond forming the skeleton may be a double bond or a triple bond, more specifically, the triple bond. Specific examples of the organic compound gas having a triple bond (acetylene-based gas) may include bis(trimethylsilyl)acetylene (BTMSA), trimethylsilylacetylene (TMSA), [(trimethylsilyl) methyl]acetylene (TMSMA), bis(chloromethyl) acetylene (BCMA), and the like.

The silicon precursor is made of a silicon-containing gas. Examples of the silicon-containing gas may include a gas of a compound having a Si-containing skeleton and a side chain bonded to the skeleton. Examples of the skeleton may include Si—Si, Si—C, Si—N, Si—O, and the like. Examples of the side chain may include a hydrogen atom, a halogen, an alkyl group having 5 or less carbon atoms, a carbon double bond or triple bond, a group in which a site bonded to Si of the skeleton is Si, C, N, or O, and the like. Examples of the silicon-containing gas constituting the silicon precursor may include a silane-based compound gas. Specific examples of the silane-based compound gas may include disilane, monosilane, trisilane, dichlorosilane, and the like. An organic silane-based compound gas such as aminosilane may be used as the silane-based compound gas.

The formation of the SiC-based film in step ST2 may be performed by an atomic layer deposition (ALD) in which the carbon precursor and the silicon precursor are sequentially supplied. Alternatively, the formation of the SiC-based film in step ST2 may be performed by a chemical vapor deposition (CVD) in which the carbon precursor and the silicon precursor are simultaneously supplied. These ALD and CVD may be performed by thermal reactions.

When the ALD is used, a SiC film may be formed at a low temperature with good controllability by plasma-free thermal reaction. In addition, when the organic compound gas having an unsaturated carbon bond is used as the carbon precursor, the temperature may be further lowered, which makes it possible to perform the film formation at a temperature less than 800 degrees C.

In particular, when the organic compound gas (acetylene-based gas) having a triple bond such as BTMSA is used as the carbon precursor and disilane is used as the silicon precursor, a film may be formed at a low temperature of 500 degrees C. or less by the following mechanism as disclosed in Patent Document 2 as well.

Disilane is thermally decomposed by being heated at a temperature around 400 degrees C. to generate $SiH_2$ radicals having unpaired electrons in Si atoms. These $SiH_2$ radicals are polarized into $\sigma+$ and $\sigma-$. It is presumed that, of these, $\sigma+$, which is a positive polarization site, becomes an electrophile that attacks $\pi$ bond of the unsaturated bond of the organic compound gas having a triple bond to decompose the organic compound gas having a triple bond, so that C of the triple bond reacts with Si of the $SiH_2$ radicals to form Si—C bonds. At this time, the $\pi$ bond of the triple bond has a smaller bonding force than that of the a bond. Thus, when the $SiH_2$ radicals attack the $\pi$ bond, the thermal reaction proceeds sufficiently even at a substrate temperature of 500 degrees C. or less to generate Si—C bonds.

The above mechanism is merely for the case where an acetylene-based gas is used as the carbon precursor and disilane is used as the silicon precursor. However, when using an organic compound gas having an unsaturated carbon bond, particularly a triple bond, as the carbon precursor, it is considered that the film formation temperature can be lowered by a similar mechanism.

Figure 2:
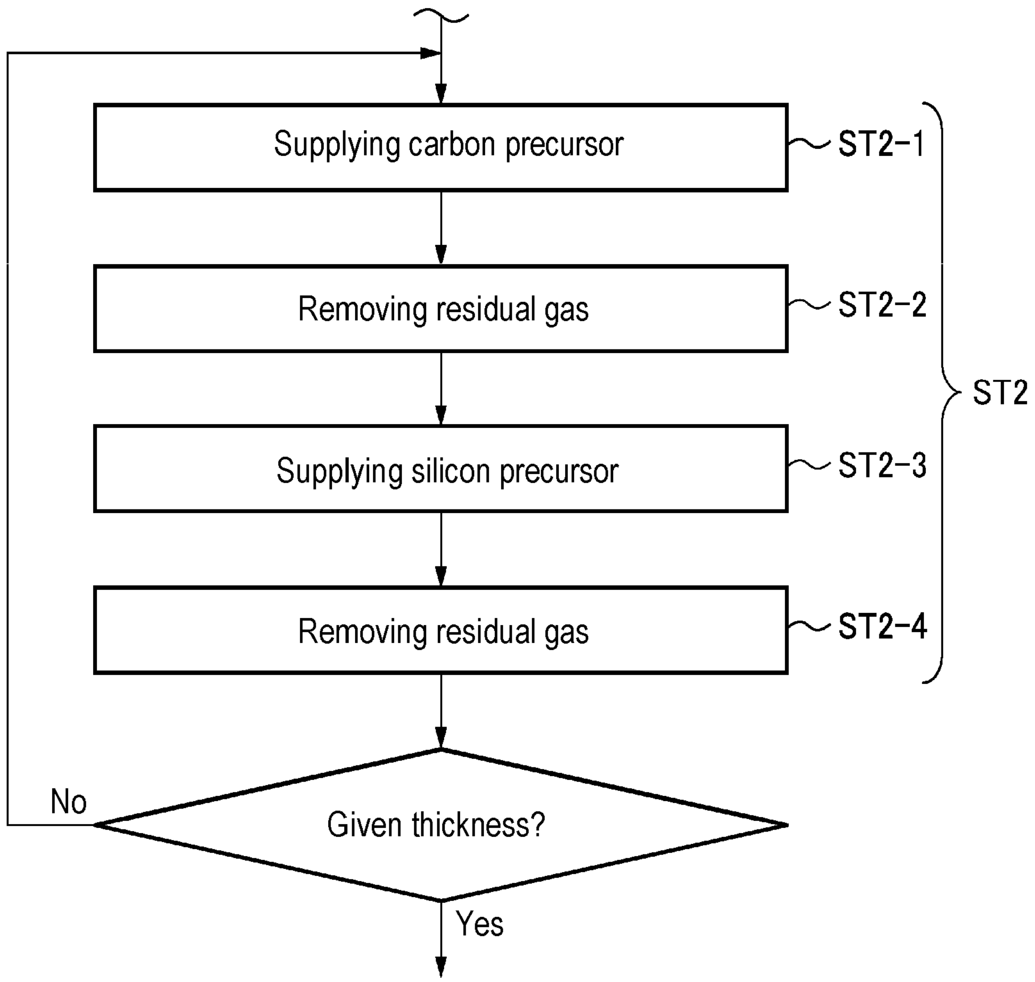
FIG. 2 is a view illustrating a flow when a SiC-based film in step ST2 is formed by ALD.

When the SiC-based film in step ST2 is formed by ALD, as illustrated in FIG. 2, a cycle including supplying the carbon precursor (step ST2-1), removing residual gas (step ST2-2), supplying the silicon precursor (step ST2-3), and removing residual gas (step ST2-4) is repeated multiple times. In step ST2-1, the carbon precursor is supplied, so that the carbon precursor is adsorbed on the substrate, and in step ST2-2, excess residual gas is removed. Then, in step ST2-3, the silicon precursor is supplied to the substrate so that the carbon precursor adsorbed on the substrate reacts with the silicon precursor to form a SiC unit film, and in step ST2-4, excess residual gas is removed. By repeating steps ST2-1 to ST2-4 multiple times, a SiC-based film having a desired thickness is obtained.

In the oxidation process in step ST3, the oxygen-containing gas is supplied to oxidize the SiC-based film into a SiOC-based film after forming the SiC-based film having the given film thickness on the substrate in step ST2. An insulative silicon-containing film with a low k-value and high etching resistance (chemical treatment resistance) is required for a semiconductor device. The SiOC-based film is a silicon-containing film having such characteristics. The SiOC-based film having the given film thickness is obtained by performing the formation of the SiC-based film and the oxidation process on the SiC-based film once or multiple times. The SiOC-based film may contain impurities and additives in addition to the SiOC.

As the oxygen-containing gas used for the oxidation process, an $O_2$ gas, a $H_2O$ gas, an $O_3$ gas), or a $H_2O_2$ gas may be used. The oxidation process at this time may be performed by a thermal reaction. Alternatively, plasma of the oxygen-containing gas may be used. The temperature during the oxidation process is not particularly limited as long as the SiC-based film is oxidized, but the oxidation process may be performed at the same temperature as the temperature during the formation of the SiC-based film in step ST2.

By adjusting the thickness of the SiC-based film before performing the oxidation process in step ST3 (the thickness of the SiC-based film after performing a first round of oxidation process and before performing a subsequent round of oxidation process), a composition of the SiOC-based film (a concentration of oxygen in the film) can be controlled. The thickness of the SiC-based film when performing the oxidation process in step ST3 may be understood based on the frequency of the oxidation process. As the thickness of the SiC-based film at this time is smaller, the frequency of the oxidation process becomes higher, and the concentration of oxygen in the film becomes higher. The thickness of the SiC-based film when performing the oxidation process may be in the range of 0.9 to 3.2 Å (0.09 to 0.32 nm). When the thickness of the SiC-based film is in this range when performing the oxidation process, the concentration of oxygen in the film may be set to 26 to 42 at %, and as will be described later, wet etching resistance is improved.

When the film formation is performed by ALD, the thickness of the SiC-based film corresponds to the number of ALD cycles. For example, when the TMSA gas is used as the carbon-containing gas and the disilane gas is used as the silicon-containing gas, since the film thickness corresponds to about 0.32 Å in one cycle of ALD when the film formation temperature is about 450 degrees C., the above-mentioned range of the film thickness of 0.9 to 3.2 Å corresponds to 3 to 10 cycles.

The composition of the SiOC-based film may also be controlled by changing the oxidization conditions such as a flow rate of the oxygen-containing gas and an oxidization time.

The processing with the plasma of a gas containing a $H_2$ gas in step ST4 is to modify the SiOC-based film formed by the oxidation process in step ST3. As described above, when forming a SiC-based film, a carbon-containing gas and a silicon-containing gas are used as the carbon precursor and the silicon precursor. Since an organic compound gas is generally used as the carbon-containing gas and a silane-based gas is generally used as the silicon-containing gas, a large amount of hydrogen is contained in the SiOC-based film. For this reason, in step ST4, the processing with the plasma of a gas containing a $H_2$ gas (hereinafter, simply referred to as "$H_2$-based plasma process") is performed on the SiOC-based film formed by the oxidation process in step ST3, and a modification process for mainly removing hydrogen components in the film is performed. By the modification process, the SiOC-based film may be densified, the film composition may also be changed, and the wet etching resistance (chemical treatment resistance) may be improved.

The gas containing a $H_2$ gas may be the $H_2$ gas alone, or a gas obtained by adding an inert gas such as an Ar gas to the $H_2$ gas. The temperature during the $H_2$-based plasma process in step ST4 is not particularly limited as long as desired modification is performed, but may be performed at the same temperature as the temperature during the formation of the SiC-based film in step ST2.

By adjusting the thickness of the SiOC-based film before performing the $H_2$-based plasma process, the modification effect may be controlled. The thickness of the SiOC-based film when performing the $H_2$-based plasma process in step ST4 may be understood based on the frequency of $H_2$-based plasma process. It can be said that as the thickness of the SiOC-based film is smaller, the frequency of $H_2$-based plasma process becomes higher. By controlling the frequency of $H_2$-based plasma process, the film composition can be controlled, and the wet etching resistance (chemical treatment resistance) and electrical properties (a k-value and a leakage property) that change accordingly can be controlled. For example, when the frequency of $H_2$-based plasma process decreases, the concentration of oxygen in the film tends to increase, and the wet etching resistance (chemical treatment resistance) tends to decrease.

The thickness of the SiOC-based film before performing the $H_2$-based plasma process may be set to the range of 0.4 to 18.7 Å and may be optimized within this range according to required properties. When the thickness of the SiOC-based film before performing the $H_2$-based plasma process is small (that is, when the frequency of $H_2$-based plasma process is high), the k-value tends to increase. On the other hand, when the thickness of the SiOC-based film is large before performing the $H_2$-based plasma process (that is, when the frequency of $H_2$-based plasma process is low), the modification effect of the $H_2$-based plasma process tends to decrease.

The modification effect can also be controlled by adjusting the processing conditions for the $H_2$-based plasma process. For example, by lengthening the processing time of the $H_2$-based plasma process, the modification effect can be further enhanced. Even when the thickness of the SiOC-based film is the same before performing the plasma process, the wet etching resistance or leakage property can be improved.

The formation of the SiC film in step ST2, the oxidation process in step ST3, and the plasma process in step ST4 may be performed in separate chambers, but are preferably performed in the same chamber. By performing such processes in the same chamber, steps ST2 to ST4 may be performed without transferring of the substrate on the way, which makes it possible to perform the processes with high throughput.

As described above, according to the present embodiment, the controllability of a film composition and film properties, such as wet etching resistance property and electrical properties of the SiOC-based film, can be improved by a simple method of adjusting the frequency and conditions of the oxidation process and the frequency and conditions of $H_2$-based plasma process.

In addition, by adjusting the thickness of the SiC-based film and the conditions of the oxidation process when performing the oxidation process, and the thickness of the SiOC-based film and the time when performing the $H_2$-based plasma process, a SiOC-based film having a desired film composition and film properties can be formed. For example, the concentration of oxygen in the SiOC-based film may be controlled in a range of 10 to 60 at %. In this range, by setting the concentration of oxygen to 10 to 45 at %, the wet etching resistance can be improved. In particular, by setting the concentration of oxygen to 26 to 42 at %, the wet etching rate for a dilute hydrofluoric acid (DHF) can be set to 10 Å/min or less. In addition, by setting the concentration of oxygen to 34 at % or more, the k-value can be set to 4.5 or less, and the leakage property (leakage value) when an electric field strength of 2 MV/cm is applied can be set to $10\times10^{-8}$ A/cm$^2$ or less. Further, by optimizing the frequency of oxidation process and the frequency or time of $H_2$-based plasma process, the k-value can be set to 4 or less, and the leakage value can be set to $10\times10^{-9}$ A/cm$^2$ or less. Further, by setting the concentration of oxygen to 34 to 45 at %, all of the wet etching characteristics, the k-value, and the leakage property can be improved.

<Film Forming Apparatus>

Next, an example of a film forming apparatus used for forming the SiOC-based film as described above will be described. Here, a single-wafer film forming apparatus in which a semiconductor wafer (hereinafter, simply referred to as a "wafer") is used as a substrate, the SiC-based film is formed on the wafer by ALD, and the oxidation process and plasma process may also be performed is illustrated. In addition, the trimethylsilylacetylene (TMSA) gas is used as the carbon precursor, the disilane (DS) gas as the silicon precursor, the $O_2$ gas as the oxygen-containing gas, and the Ar gas as the inert gas.

Figure 3:
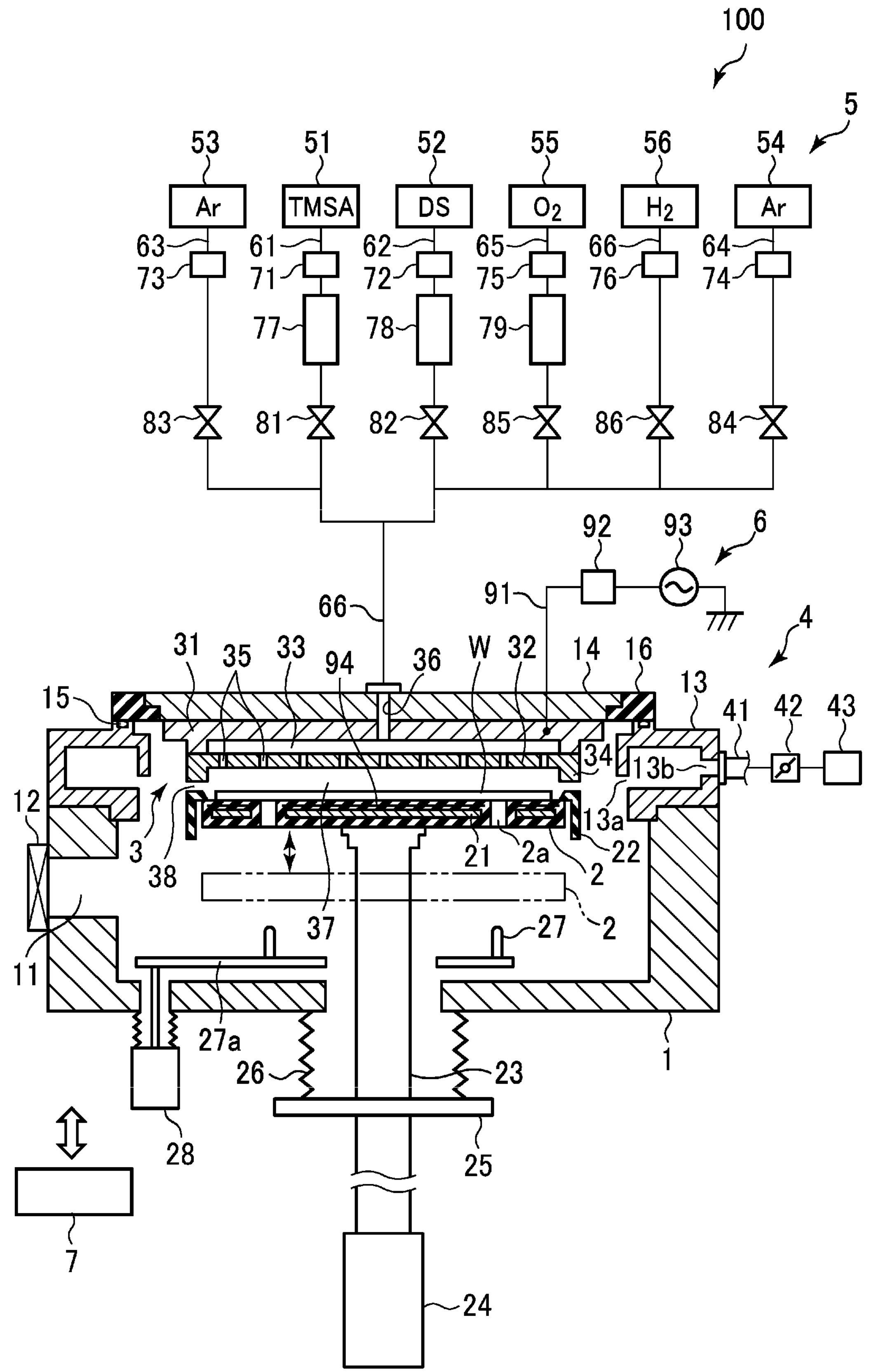
FIG. 3 is a cross-sectional view illustrating an example of a film forming apparatus used for executing the film forming method according to an embodiment.

FIG. 3 is a cross-sectional view illustrating an example of the film forming apparatus used for forming the SiOC-based film.

As illustrated in FIG. 3, a film forming apparatus 100 includes a chamber 1, a susceptor 2, a shower head 3, an exhauster 4, a gas supply mechanism 5, a plasma generating mechanism 6, and a controller 7.

The chamber 1 is made of a metal such as aluminum, and has a substantially cylindrical shape. A loading/unloading port 11 is formed in a sidewall of the chamber 1 to load or unload the wafer W therethrough. The loading/unloading port 11 is configured to be opened/closed by a gate valve 12. An annular exhaust duct 13 having a rectangular cross section is provided on a main body of the chamber 1. A slit 13*a* is formed along an inner peripheral surface of the exhaust duct 13. In addition, an exhaust port 13*b* is formed in an outer wall of the exhaust duct 13. On an upper surface of the exhaust duct 13, a ceiling wall 14 is provided to close an upper opening of the chamber 1. An insulating ring 16 is fitted around an outer periphery of the ceiling wall 14. A space between the insulating ring 16 and the exhaust duct 13 is hermetically sealed by a seal ring 15.

The susceptor 2 horizontally supports the wafer W inside the chamber 1. The susceptor 2 is formed in a disk shape having a size corresponding to the wafer W, and is supported by a support member 23. The susceptor 2 is made of a ceramic material such as aluminum nitride (AlN) or a metal material such as aluminum or a nickel-based alloy, and includes a heater 21 embedded therein so as to heat the wafer W. The heater 21 is configured to generate heat by being fed with power from a heater power supply (not illustrated). By controlling an output of the heater 21 by a temperature signal of a thermocouple (not illustrated) provided in the vicinity of a wafer placement surface on an upper surface of the susceptor 2, the wafer W is controlled to have a predetermined temperature.

The susceptor 2 is provided with a cover member 22 made of ceramic such as alumina so as to cover an outer peripheral region of the wafer placement surface and a side surface of the susceptor 2.

The support member 23, which supports the susceptor 2, extends downward of the chamber 1 from the center of a bottom surface of the susceptor 2 via a hole formed in a bottom wall of the chamber 1, and is connected to the lifting mechanism 24 at a lower end of the support member 23. The susceptor 2 is configured to be raised/lowered by the lifting mechanism 24 via the support member 23 between a processing position illustrated in FIG. 3 and a transfer position (indicated by one-dot chain line) below the processing position. At the transfer position, the wafer can be transferred. In addition, a flange member 25 is installed on the support member 23 below the chamber 1. A bellows 26, which isolates an internal atmosphere of the chamber 1 from ambient air, is provided between the bottom surface of the chamber 1 and the flange member 25 to be flexible the vertical movement of the susceptor 2.

Three wafer support pins 27 (of which only two are illustrated) are provided in the vicinity of the bottom surface of the chamber 1 to protrude upward from a lifting plate 27*a*. The wafer support pins 27 are configured to be raised and lowered via the lifting plate 27*a* by a lifting mechanism 28 provided below the chamber 1. The wafer support pins 27 are inserted into respective through-holes 2*a* provided in the susceptor 2 located at the transfer position so that they can move upward and downward with respect to the upper surface of the susceptor 2. By raising and lowering the wafer support pins 27 in this manner, the wafer W is delivered between a wafer transfer mechanism (not illustrated) and the susceptor 2.

The shower head 3 is a metal member configured to supply a processing gas into the chamber 1 in the form of a shower, is provided to face the susceptor 2, and has substantially the same diameter as the susceptor 2. The shower head 3 includes a main body 31 fixed to the ceiling wall 14 of the chamber 1 and a shower plate 32 connected to a bottom of the main body 31. A gas diffusion space 33 is formed between the main body 31 and the shower plate 32. In the gas diffusion space 33, a gas inlet hole 36 is provided to penetrate the centers of the main body 31 and the ceiling wall 14 of the chamber 1. An annular protrusion 34 protruding downward is formed at a peripheral edge of the shower plate 32. Gas ejection holes 35 are formed in a flat surface inside the annular protrusion 34 of the shower plate 32.

In the state in which the susceptor 2 is located at the processing position, a processing space 37 is formed between the shower plate 32 and the susceptor 2, and the annular protrusion 34 and the upper surface of the cover member 22 of the susceptor 2 come close to each other to form an annular gap 38.

The exhauster 4 exhausts the interior of the chamber 1, and includes an exhaust pipe 41 connected to the exhaust port 13*b* of the exhaust duct 13, an automatic pressure control valve (APC) 42 and a vacuum pump 43 which are connected to the exhaust pipe 41. During processing, a gas within the chamber 1 reaches the exhaust duct 13 via the slit 13*a*, and is exhausted from the exhaust duct 13 through the exhaust pipe 41 by the exhaust mechanism 42 of the exhauster 4.

The gas supply mechanism 5 supplies a gas to the shower head 3, and includes a TMSA gas source 51, a DS gas source 52, a first Ar gas source 53, a second Ar gas source 54, an $O_2$ gas source 55, and an $H_2$ gas source 56. The TMSA gas source 51 supplies a TMSA gas as the carbon-containing gas when forming the SiC film. The DS gas source 52 supplies a DS gas as the silicon-containing gas when forming the SiC film. The first Ar gas source 53 and the second Ar gas source 54 supply an Ar gas that functions as an additive gas, a carrier gas, a purge gas, or the like. The $O_2$ gas source 55 supplies an $O_2$ gas as the oxygen-containing gas used for oxidation process. The $H_2$ gas source 56 supplies a $H_2$ gas used for the plasma process.

The gas supply mechanism 5 further includes a TMSA gas supply pipe 61, a DS gas supply pipe 62, a first Ar gas supply pipe 63, a second Ar gas supply pipe 64, an $O_2$ gas supply pipe 65, and an $H_2$ gas supply pipe 66. The TMSA gas supply pipe 61 extends from the TMSA gas source 51, the DS gas supply pipe 62 extends from the DS gas source 52, the first Ar gas supply line 63 extends from the first Ar source 53, and the second Ar gas supply line 64 extends the second Ar gas source 54. In addition, the $O_2$ gas supply pipe 65 extends from the $O_2$ gas source 55, and the $H_2$ gas supply pipe 66 extends from the $H_2$ gas source 56.

The TMSA gas supply pipe 61 and the DS gas supply pipe 62 are joined in a junction pipe 66. The junction pipe 66 is connected to the above-described gas inlet hole 36. In addition, the first Ar gas supply pipe 63 is connected to the TMSA gas supply pipe 61, and the second Ar gas supply pipe 64, the $O_2$ gas supply pipe 65, and the $H_2$ gas supply pipe 66 are connected to the DS gas supply pipe 62.

The TMSA gas supply pipe 61 is provided with a flow rate controller 71 such as a mass flow controller, a storage tank 77, and an opening/closing valve 81 from the upstream side. The DS gas supply pipe 62 is provided with a flow rate controller 72, a storage tank 78, and an opening/closing valve 82 from the upstream side. The first Ar gas supply pipe 63 is provided with a flow rate controller 73 and an opening/closing valve 83 from the upstream side, and the second Ar gas supply pipe 64 is provided with a flow rate controller 74 and an opening/closing valve 84 from the upstream side. In addition, the $O_2$ gas supply pipe 65 is provided with a flow rate controller 75, a storage tank 79, and an opening/closing valve 85 from the upstream side. The $H_2$ gas supply pipe 66 is provided with a flow rate controller 76 and an opening/closing valve 86 from the upstream side.

By switching the opening/closing valves 81, 82, 83, 84, 85, and 86, the ALD process, the oxidation process, and the plasma process, which will be described later, are performed. In addition, the storage tanks 77, 78, and 79 temporarily store respective gases and are pressurized to a predetermined pressure. In this state, the opening/closing valves are opened to supply the gases into the chamber 1.

The purge gas or the like is not limited to the Ar gas, and other inert gases, such as a $N_2$ gas and noble gases other than Ar, may be used.

The plasma generating mechanism 6 includes: a power feed line 91 connected to the main body 31 of the shower head 3; a matcher 92 and a radio-frequency power supply 93 which are connected to the power feed line 91; and an electrode 94 embedded in the susceptor 2. When radio-frequency power is supplied to the shower head 3 from the radio-frequency power supply 93, a radio-frequency electric field is formed between the shower head 3 and the electrode 94. By this radio-frequency electric field, plasma of a gas containing a $H_2$ gas is generated during the plasma process. As the gas containing a $H_2$ gas, the $H_2$ gas alone may be used. Alternatively, an Ar gas may be added to the $H_2$ gas. A frequency of the radio-frequency power supply 93 may be set to 450 kHz to 100 MHz. For example, the frequency may be 40 MHz. Plasma of an $O_2$ gas, which is an oxygen-containing gas, may be generated by the plasma generating mechanism 6 during the oxidation process.

The controller 7 includes a main controller configured with a computer (CPU) that controls each component of the film forming apparatus, such as a valve, a mass flow controller, a power supply, a heater, or a vacuum pump, an input device, an output device, a display device, and a storage device. The storage device stores parameters of various processes performed by the film forming apparatus 100. In addition, the storage device includes a storage medium in which a program for controlling processing to be executed by the film forming apparatus 100, that is, a processing recipe, is stored. The main controller calls a predetermined processing recipe stored in the storage medium, and causes the film forming apparatus 100 to execute predetermined processing, based on the processing recipe.

In the film forming apparatus 100 configured as described above, first, the gate valve 12 is opened, and the wafer W is loaded into the chamber 1 via the loading/unloading port 11 and placed on the susceptor 2 by a transfer device (not illustrated). The transfer device is retracted, and the susceptor 2 is raised to the processing position. Then, the gate valve 12 is closed to maintain the interior of the chamber 1 in a predetermined pressure-reduced state, and the heater 21 controls the temperature of the susceptor 2 (the temperature of the substrate) to 300 to 500 degrees C., for example, 450 degrees C.

Figure 4:
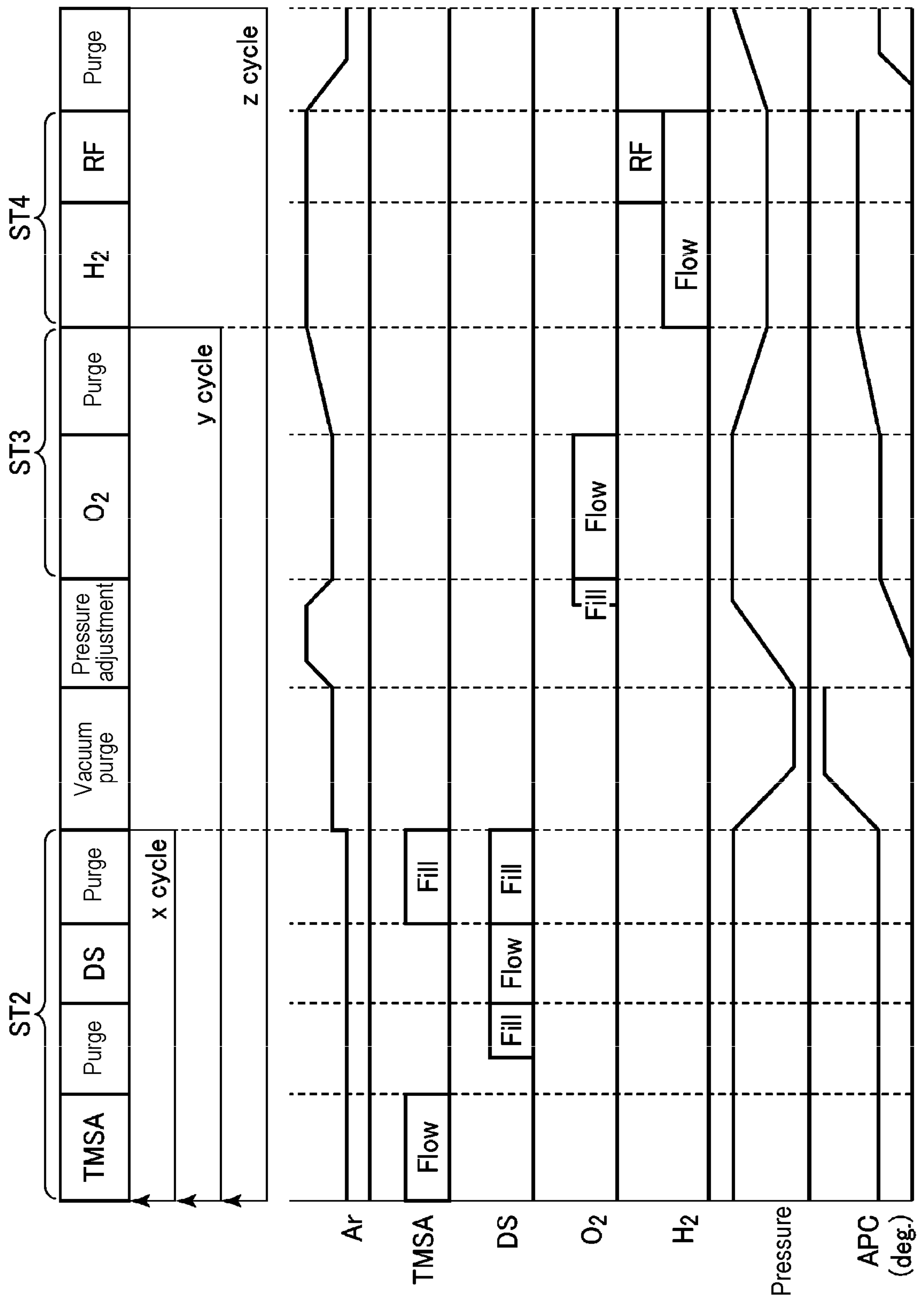
FIG. 4 is a chart illustrating a gas supply, a pressure, and an opening degree of an APC when performing a SiC film forming process in step ST2, an oxidation process in step ST3, and a plasma process in step ST4.

In this state, as illustrated in FIG. 4, the SiC film forming process in step ST2, the oxidation process in step ST3, and the plasma process in step ST4 are performed. FIG. 4 is a chart illustrating a gas supply, a pressure, and an opening degree of APC when performing the SiC film forming process in step ST2, the oxidation process in step ST3, and the plasma process in step ST4.

In step ST2, the SiC film is formed by ALD in which the supply of the TMSA gas (step ST2-1), the purge of the interior of the chamber (residual gas removal) (step ST2-2), the supply of the DS gas (step ST2-3), and the purge of the interior of the chamber (residual gas removal) (step ST2-4) are repeated. At this time, the number of ALD cycles is set to x number of cycles, and the thickness of the SiC film is set to a given film thickness.

In ALD in step ST2, in the state in which the opening/closing valves 83 and 84 are kept opened, the opening/closing valves 81 and 82 are operated at a high speed while the Ar gas is supplied at a constant amount from the first Ar gas source 53 and the second Ar gas source 54. During the purging, both the opening/closing valves 81 and 82 are closed. As a result, the supply of the TMSA gas and the supply of the DS gas are alternately performed while performing the purging therebetween. The TMSA gas and the DS gas are once stored in storage tanks 77 and 78 (Fill state). In this state, the TMSA gas and the DS gas are supplied while the storage tanks 77 and 78 are pressurized. After the supply of the gases, the storage tanks 77 and 78 are in a state of storing the gases (in the Fill state).

Examples of conditions other than the temperature in step ST2 are as follows.

Flow rate of Ar gas (total flow rate): 0 to 1,500 sccm
Flow rate of TMSA gas: 30 to 200 sccm
Flow rate of DS gas: 30 to 350 sccm
Time for ST2-1: 1 to 6 sec
Time for ST2-2 and ST2-4: 5 to 15 sec
Time for ST2-3: 0.05 to 1 sec
Pressure: 1,266 to 3,000 mTorr After performing step ST2 in x number of cycles of ALD, a vacuum purging in which the automatic pressure control valve (APC) is fully opened and the interior of the chamber 1 is in an attraction state, and a pressure adjustment based on the Ar gas are performed. Subsequently, the oxidation process in step ST3 is performed.

In the state in which the temperature of the susceptor 2 (substrate temperature) is controlled to 300 to 500 degrees C. (e.g., 450 degrees C.) and the Ar gas is supplied, the oxidation process in step ST3 is performed by opening the opening/closing valve 85 to supply the $O_2$ gas from the $O_2$ gas source 55 as the oxygen-containing gas. Thereafter, the opening/closing valve 85 is closed, and the purging based on the Ar gas is performed. By this oxidation process, the SiC-based film formed on the substrate W is oxidized and turned into a SiOC-based film. Then, the x number of cycles including the formation of the SiC-based film and the oxidation process are repeated y number of cycles to obtain the SiOC-based film having a given film thickness.

Examples of conditions other than the temperature when performing step ST3 are as follows.

Flow rate of Ar gas (total flow rate): 600 to 1,500 sccm
Flow rate of $O_2$ gas: 250 to 2,000 sccm
Time: 2 to 8 see
Pressure: 1,266 to 3,000 Pa After performing step ST2 based on ALD and step ST3 the y number of cycles, the plasma process in step ST4 is performed. In the state in which the temperature of the susceptor 2 (substrate temperature) is controlled to 300 to 500 degrees C. (e.g., 450 degrees C.) and the Ar gas is supplied, the plasma process in step ST4 is performed by operating the opening/closing valve 86 to supply the $H_2$ gas from the $H_2$ gas source 55 and supplying the radio-frequency power (RF power) from the radio-frequency power supply 93. Thereafter, the opening/closing valve 86 is closed, and the purging based on the Ar gas is performed. The SiOC-based film formed on the substrate W is modified by this plasma process.

Then, after the x number of cycles including the formation of the SiC-based film and the oxidation process are repeated the y number of cycles, a cycle including the plasma process is performed z number of cycles to obtain a SiOC-based film modified to have a given film thickness.

Examples of conditions other than the temperature when performing ST4 are as follows.

Flow rate of Ar gas (total flow rate): 0 to 9,000 sccm
Flow rate of $H_2$ gas: 1,000 to 4,000 sccm
RF power: 50 to 400 W
RF time: 1 to 8 see
Pressure: 266 to 2,666 Pa x, which is the number of cycles when forming the SiC-based film, corresponds to the thickness of the SiC-based film before performing the oxidation process in step ST3, and indicates the frequency of oxidation process. In addition, y, which is the number of cycles when forming the SiOC-based film, corresponds to the thickness of the SiOC film before performing the plasma process in step ST4, and indicates the frequency of $H_2$-based plasma process. By changing x, the frequency of oxidation process can be adjusted, and by changing y, the frequency of modification of the SiOC-based film by the $H_2$-based plasma process can be adjusted. By controlling the frequency of oxidation process by x and the frequency of plasma modification by y in this manner, the composition of the SiOC-based film (the concentration of oxygen in the film) can be controlled. In addition, the composition of the SiOC-based film (the concentration of oxygen in the film) can also be controlled by changing the conditions for oxidation process (time, gas flow rate, and the like) and the conditions for the $H_2$-based plasma process (time and the like). Wet etching resistance (chemical treatment resistance), which changes with the composition of the SiOC-based film (the concentration of oxygen in the film), or electric characteristics such as a k-value and a leakage property can be similarly controlled.

Further, since the formation of the SiC film in step ST2, the oxidation process in step ST3, and the plasma process in step ST4 can be continuously performed by the film forming apparatus 100 in the same chamber, a SiOC-based film having high controllability of film composition and film properties can be formed with high throughput.

<Experimental Examples>

Next, experimental examples that support the above-described embodiments will be described.

Here, bare-Si substrates were prepared as substrates. With the film forming apparatus of FIG. 3, SiC-based films were formed on the substrates by performing the formation of a SiC based film by ALD using a TMSA gas and a DS gas (step ST2), the oxidation process with an $O_2$ gas (step ST3), and the $H_2$-based plasma process with a $H_2$ gas and an Ar gas (step ST4) in the sequence illustrated in FIG. 4. The conditions at this time were as described above, and x and y were variously changed.

Figure 5:
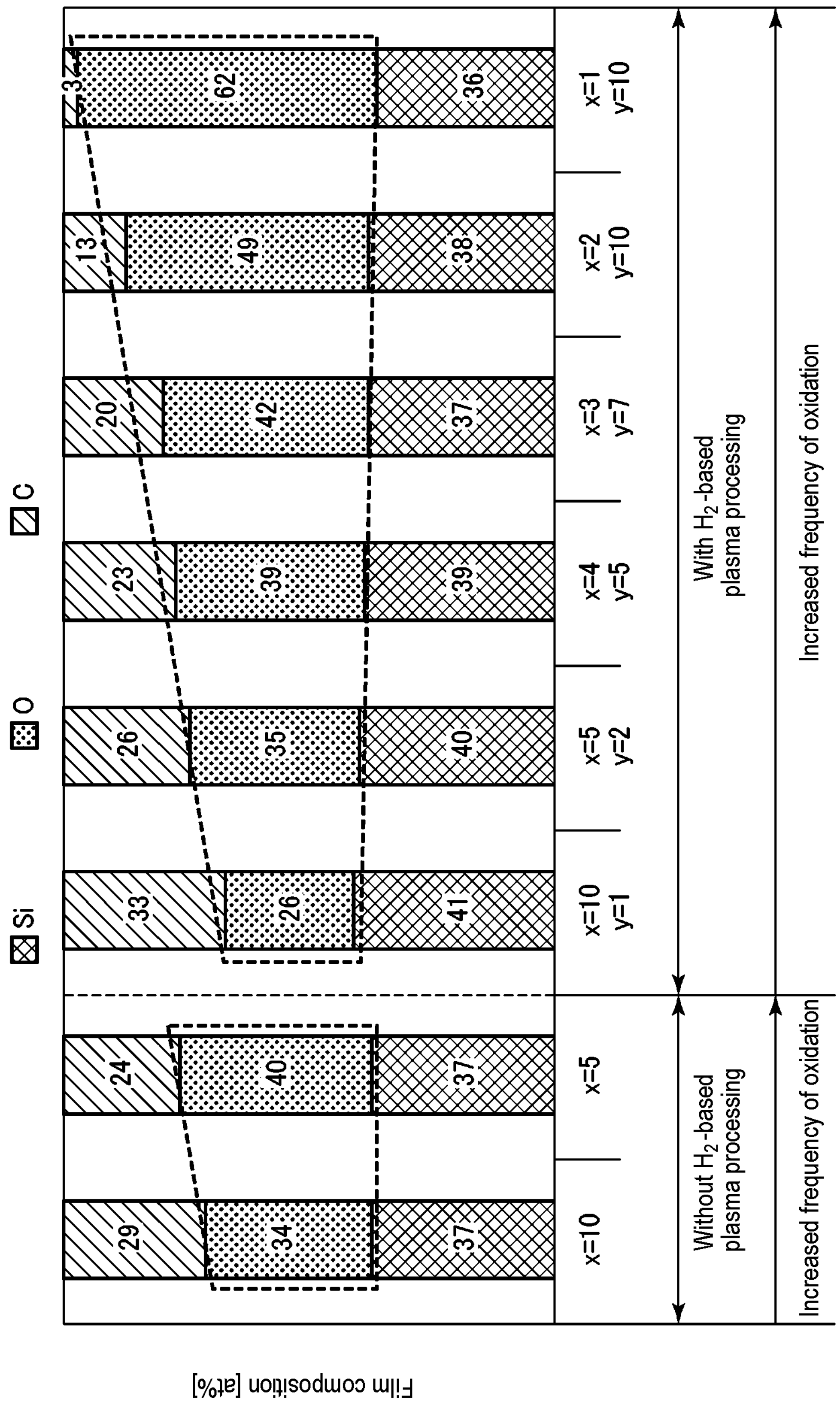
FIG. 5 is a diagram illustrating a relationship between number of cycles x when forming the SiC-based film, which corresponds to a frequency of the oxidation process, and film compositions.

FIG. 5 is a diagram illustrating a relationship between the number of cycles x during the formation of SiC-based films, which corresponds to the frequency of oxidation process, and film compositions. Here, the number of cycles y corresponding to the frequency of $H_2$-based plasma process is also changed. In addition, film compositions when the $H_2$-based plasma process was not performed are also illustrated. In this figure, only Si, O, and C are considered, and the ratio of each component to the total of these components is indicated by % (at %), and other components, such as H, are not considered. The same applies to the following figures. As illustrated in this figure, it can be seen that as the value of x becomes smaller, that is, as the frequency of oxidation process becomes higher, the concentration of oxygen in the film increases, and the film composition can be controlled by the frequency of oxidation process. In addition, when comparing the presence and absence of the $H_2$-based plasma process, it can be seen that, by performing the $H_2$-based plasma process, the concentrations of oxygen in the films decrease with the same frequencies of oxidation process.

Figure 6:
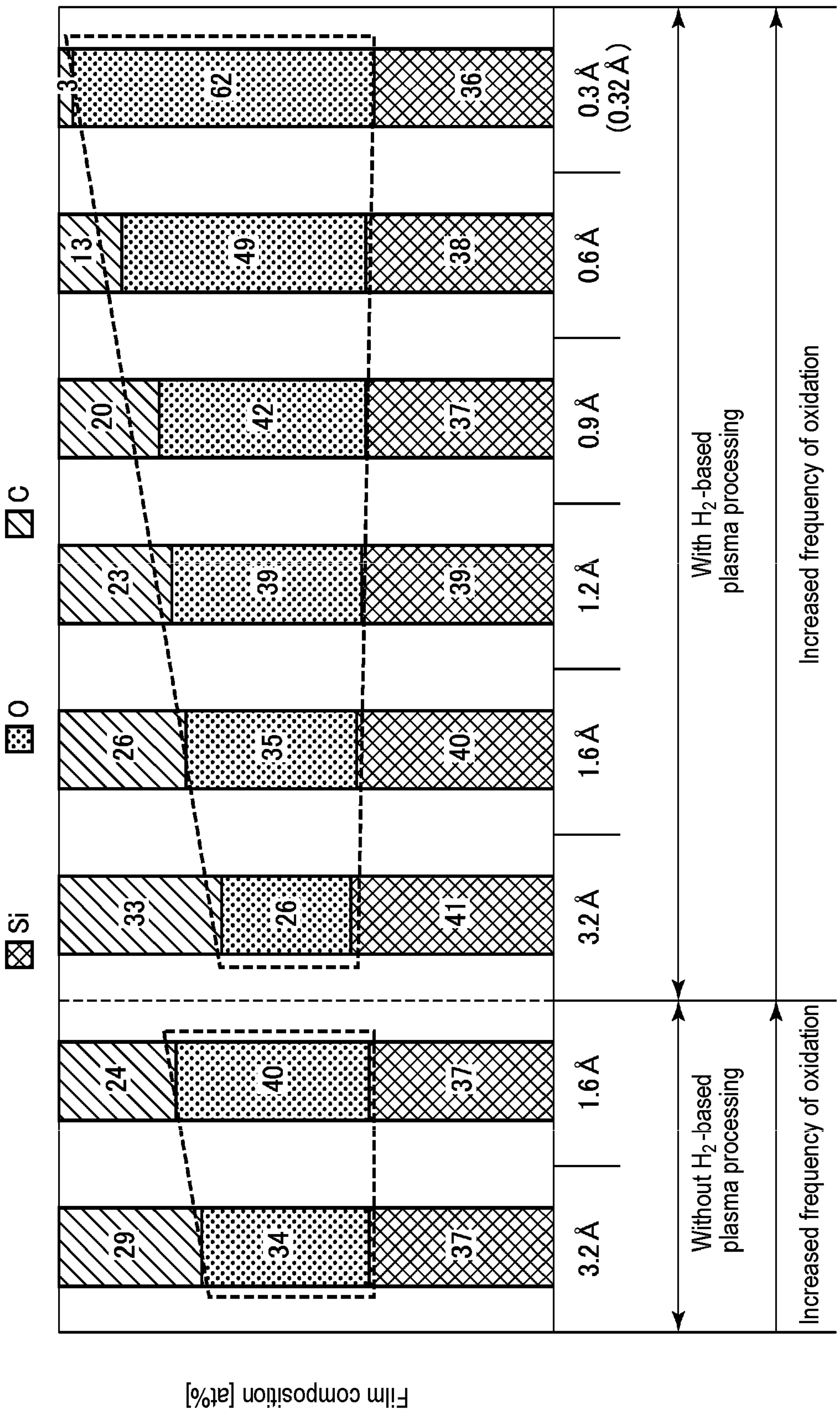
FIG. 6 is a diagram illustrating a relationship between film thicknesses and film compositions of SiC-based films for one round of oxidation process, where x in FIG. 5 is replaced by the film thicknesses.

FIG. 6 is a diagram illustrating a relationship between film thicknesses and film compositions of SiC-based films for one round of oxidation process, where x in FIG. 5 is replaced by film thicknesses from 0.32 Å which is the thickness of the SiC-based film in one round of ALD cycle. The concentrations of oxygen in the films increase as the thicknesses of the SiC-based films decrease when performing the oxidation process.

Figure 7:
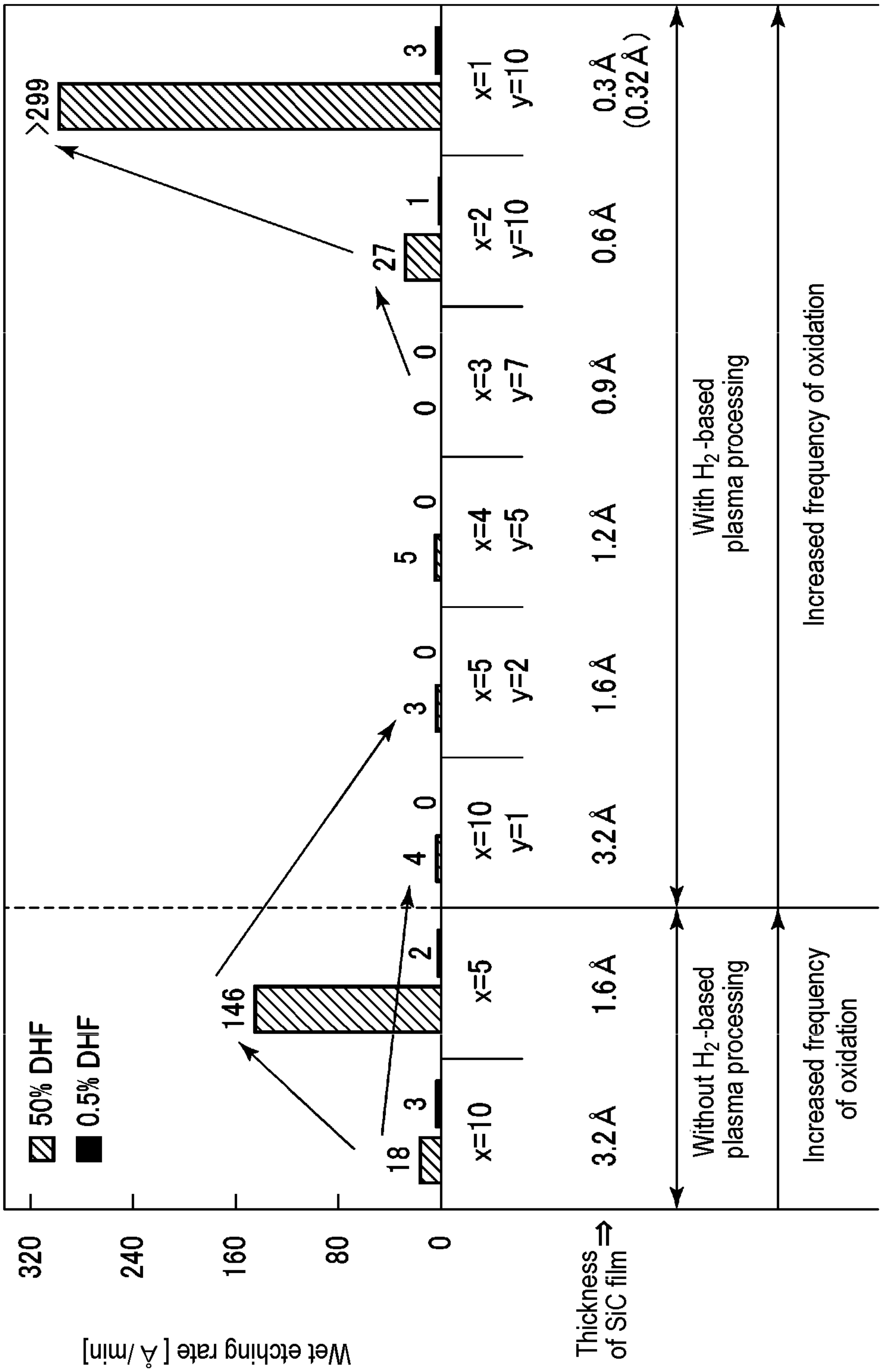
FIG. 7 is a diagram illustrating a relationship between DHF resistance and the number of cycles x during the formation of SiC-based films, which corresponds to frequencies of oxidation process, before performing the oxidation process.

FIG. 7 is a diagram illustrating a relationship between DHF resistance and the number of cycles x during the formation of SiC-based films, which corresponds to the frequency of oxidation process, before performing the oxidation process. In addition, as in FIG. 5, the results obtained when the number of cycles y, which corresponds to the frequencies of $H_2$-based plasma process, were changed, and the $H_2$-based plasma process was not performed, are also illustrated. As illustrated in this figure, the DHF resistance is low without the $H_2$-based plasma process after the oxidation process, and the DHF resistance is lowered with the increase in x (the increase in the frequency of oxidation process). In this regard, it can be seen that by performing the $H_2$-based plasma process after the oxidation process, the DHF resistance is improved, and when x is 3 or more, that is, when the thickness of the SiC-based film before performing the oxidation process is 0.9 Å or more, the wet rate (WER) by DHF is almost zero. However, it can be seen that when the frequency of oxidation process increases, and when x is 2 or less, that is, when the thicknesses of the SiC-based films before performing the oxidation process are 0.6 Å or less, the DHF resistance is low even when the $H_2$-based plasma process is added.

Figure 8:
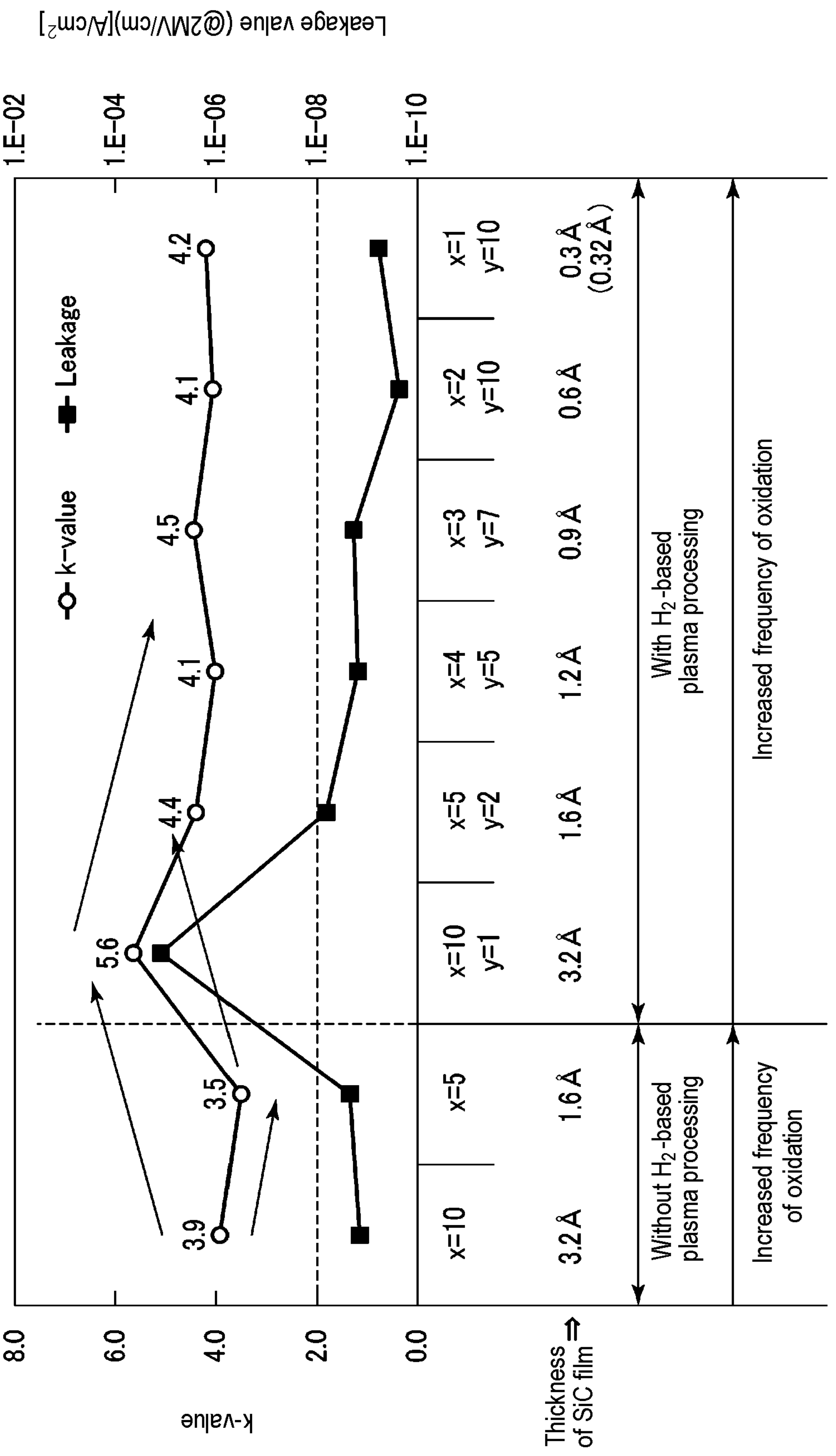
FIG. 8 is a diagram illustrating a relationship between k-values and leakage values of films and the number of cycles x during the formation of SiC-based films, which corresponds to the frequency of oxidation process.

FIG. 8 is a diagram illustrating a relationship between k-values and leakage values of films and the number of cycles x during the formation of SiC-based films, which corresponds to the frequency of oxidation process. Here, the number of cycles y corresponding to the frequencies of $H_2$-based plasma process is also changed. As illustrated in this figure, without the $H_2$-based plasma process, at x=10 (the oxidation process being performed every 3.2 Å of the thickness of the SiC-based film), k is 3.9, good leakage values of $1\times10^{-8}$ A/cm$^2$ or less are obtained when the electric field strength of 2 MV/cm is applied. However, when the $H_2$-based plasma process is performed (y=1), the k-value exceeds 4.5 and the leakage value is higher than $1\times10^{-8}$ A/cm$^2$ at the same x value. On the other hand, it has been confirmed that even when the $H_2$-based plasma process is performed, when x is 5 or less, that is, when the thicknesses of the SiC-based films before the oxidation process are 1.6 Å or less, the k-values are 4.5 or less, and good leakage values of $1\times10^{-8}$ A/cm$^2$ or less are obtained.

Figure 9:
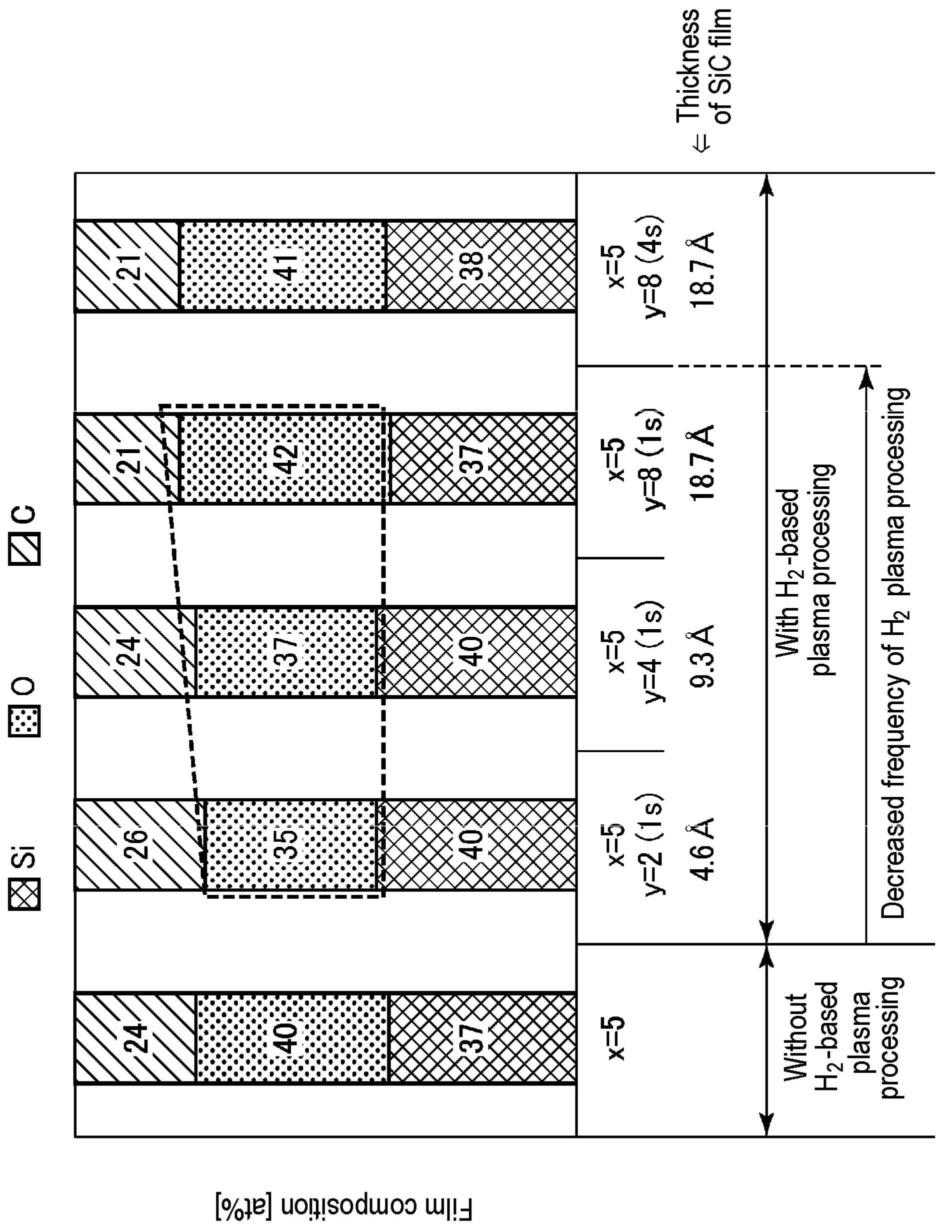
FIG. 9 is a diagram illustrating a relationship between film compositions and the number of cycles y, which corresponds to a frequency of $H_2$ plasma process, when the number of cycles x during the formation of SiC-based films before performing the oxidation process was fixed at 5.

FIG. 9 is a diagram illustrating a relationship between film compositions and the number of cycles y, which corresponds to the frequencies of $H_2$-based plasma process, when the number of cycles x during the formation of SiC-based films before performing the oxidation process was fixed at 5. Here, y is varied between 2 and 8, and the time for the $H_2$-based plasma process is set to 1 sec, but in the case of y=8, the film composition was also similarly obtained for the case where the time for the $H_2$-based plasma process was set to 4 sec. In addition, a film composition when the $H_2$-based plasma process was not performed is also illustrated. In addition, x=5 corresponds to a film thickness of 1.6 Å before performing the oxidation process. Further, the formation rate of the SiOC-based film when x=5 is 0.47 Å/cycle, the thicknesses of the SiOC-based films before performing the $H_2$-based plasma process at y=2, 4, and 8 are 4.6 Å, 9.3 Å, and 18.7 Å, respectively. As illustrated in this figure, it has been confirmed that since the concentration of oxygen in the film increases as y increases, that is, as the frequency of $H_2$-based plasma process decreases, it is possible to control the film composition by the frequency of $H_2$-based plasma process.

Figure 10:
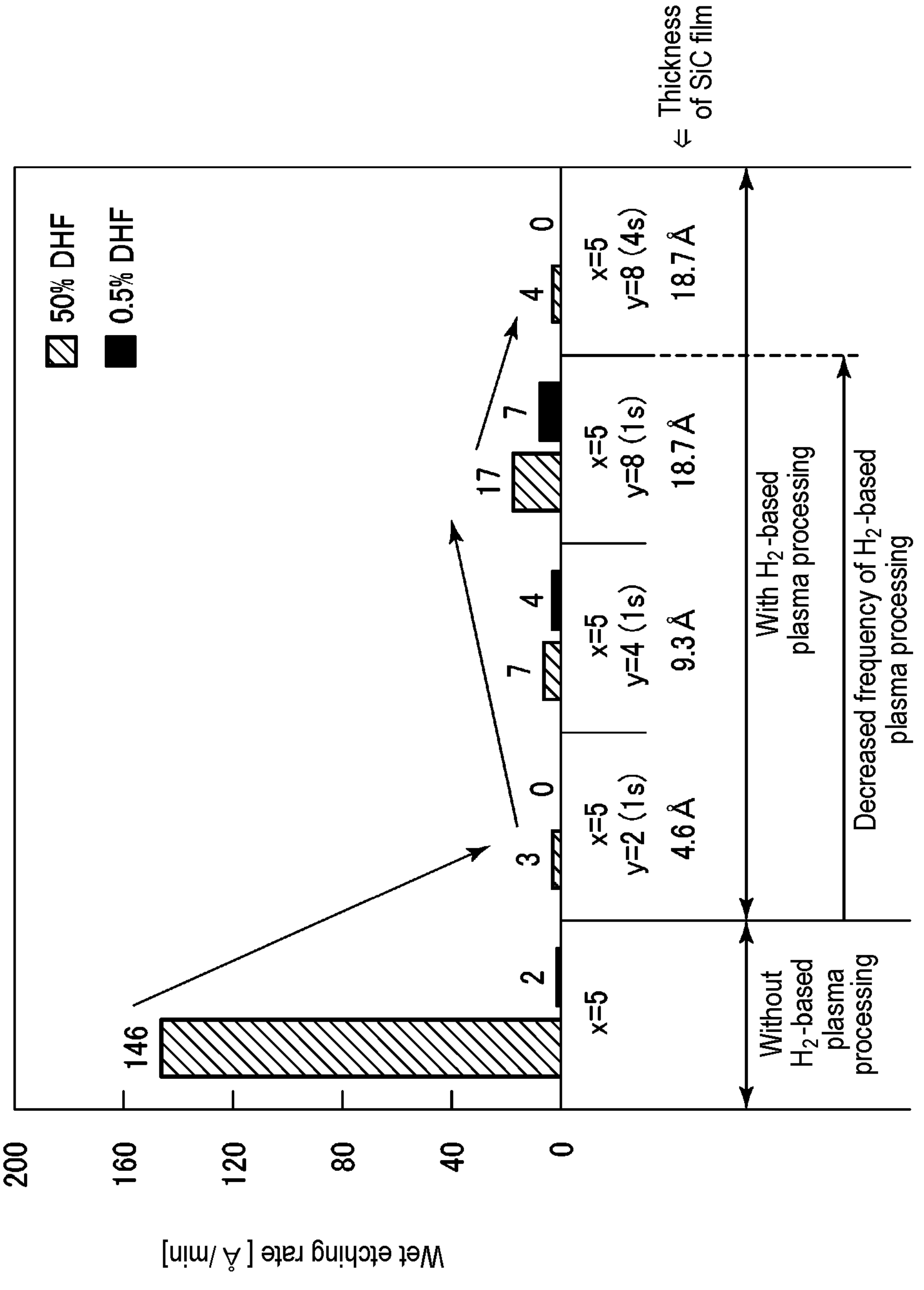
FIG. 10 is a diagram illustrating a relationship between DHF resistance of films and the number of cycles y, which corresponds to a frequency of $H_2$ plasma process, when the number of cycles x during the formation of SiC-based films before performing the oxidation process was fixed at 5.

FIG. 10 is a diagram illustrating a relationship between the DHF resistance of films and the number of cycles y, which corresponds to the frequencies of $H_2$-based plasma process, when the number of cycles x during the formation of SiC-based films before performing the oxidation process was fixed at 5. Here, as in FIG. 9, y was changed between 2 and 8, the time for the $H_2$-based plasma process was set to 1 sec, and in the case of y=8, the DHF resistance was also similarly obtained for the case where the time for the $H_2$-based plasma process was set to 4 sec. In addition, the results when the $H_2$-based plasma process was not performed are also illustrated. As illustrated in this figure, it can be seen that while the DHF resistance is improved by performing the $H_2$-based plasma process, as y increases, that is, as the frequency of $H_2$-based plasma process decreases, the DHF resistance decreases (the WER increases). The WER is 17 Å/min at y=8 (when the thickness of the SiOC film is 18.7 Å). At y=4 (when the thickness of the SiOC film is 9.3 Å) and y=2 (when the thickness of the SiOC film is 4.6 Å), the WERs are 7 Å/min and 3 Å/min, respectively, which are lower than the standard of 10 Å/min, indicating good DHF resistance. In addition, even at y=8, the WER is improved to 4 Å/min by lengthening the time for the $H_2$-based plasma process from 1 sec to 4 sec.

Figure 11:
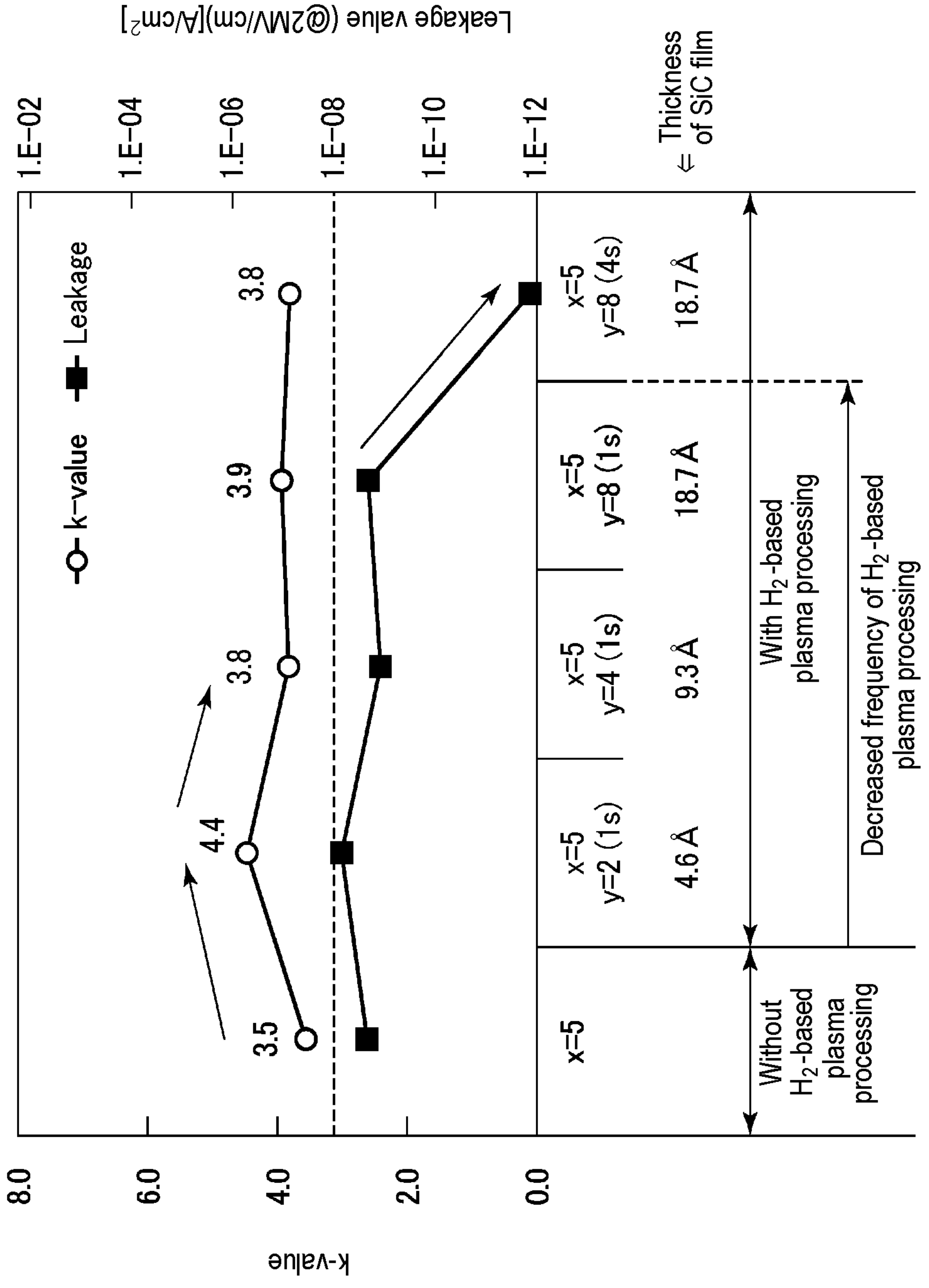
FIG. 11 is a diagram illustrating a relationship between k-values and leakage values of films and the number of cycles y, which corresponds to frequencies of $H_2$ plasma process, when the number of cycles x during the formation of SiC-based films before performing the oxidation process was fixed at 5.

FIG. 11 is a diagram illustrating a relationship between k-values and leakage values of films and the number of cycles y, which corresponds to the frequencies of $H_2$-based plasma process, when the number of cycles x during the formation of SiC-based films before performing the oxidation process was fixed at 5. Here, as in FIG. 9, y was changed between 2 and 8, the time for the $H_2$-based plasma process was set to 1 sec, and in the case of y=8, the k-value and the leakage value were also similarly obtained for the case where the time for $H_2$-based plasma process was set to 4 sec. In addition, the results when the $H_2$-based plasma process was not performed are also illustrated. As illustrated in this figure, at y=2 (when the thickness of the SiOC film is 4.6 Å), the k-value and the leakage value are increased compared to the case where the $H_2$-based plasma process was not performed, but the k-value of 4.5 or less and the leakage value of $1\times10^{-8}$ A/cm$^2$ or less are satisfied. In addition, when y is 4 or more (when the thicknesses of the SiOC films are 9.3 Å or more), the k-values decrease to less than 4 while the leakage values of $1\times10^{-8}$ A/cm$^2$ or less are satisfied. Further, when the time for the $H_2$-based plasma process increases from 1 sec to 4 sec at y=8, the leakage value further decreases.

Next, based on the above results, the relationship between the concentrations of oxygen in films and film properties was examined.

Figure 12:
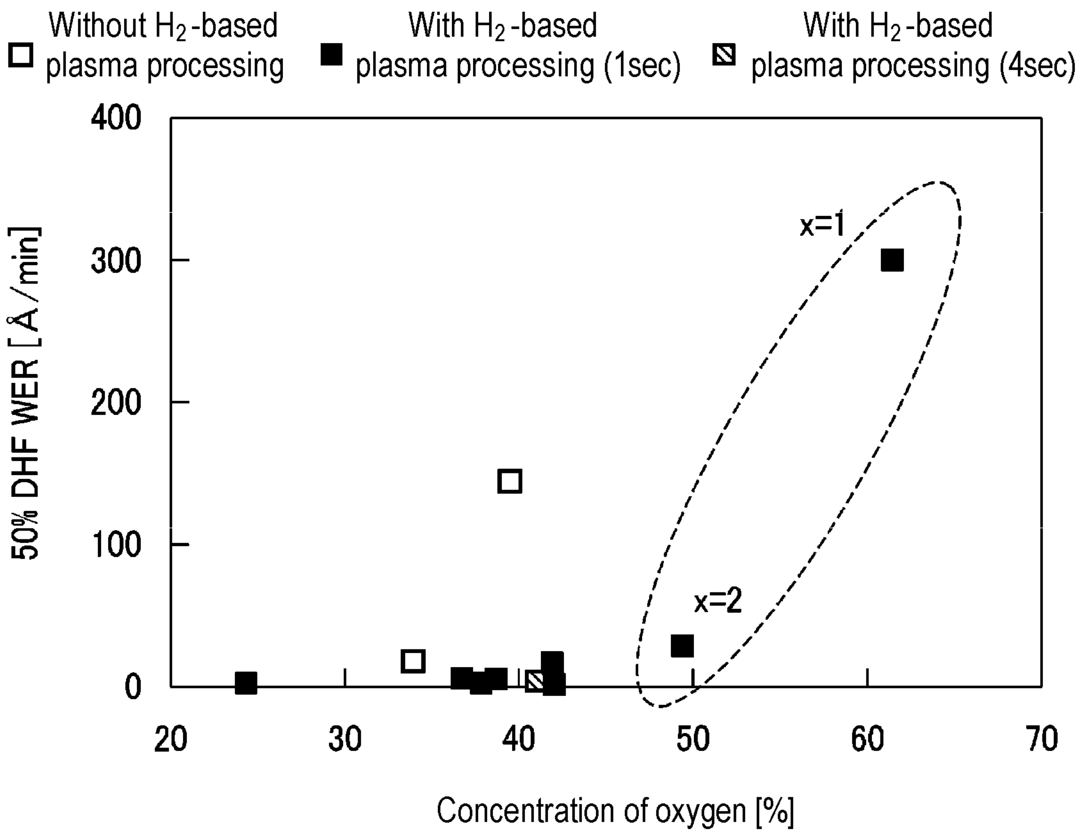
FIG. 12 is a diagram illustrating a relationship between concentrations of oxygen and WERs for a 50% DHF in SiOC films formed under various conditions.
Figure 13:
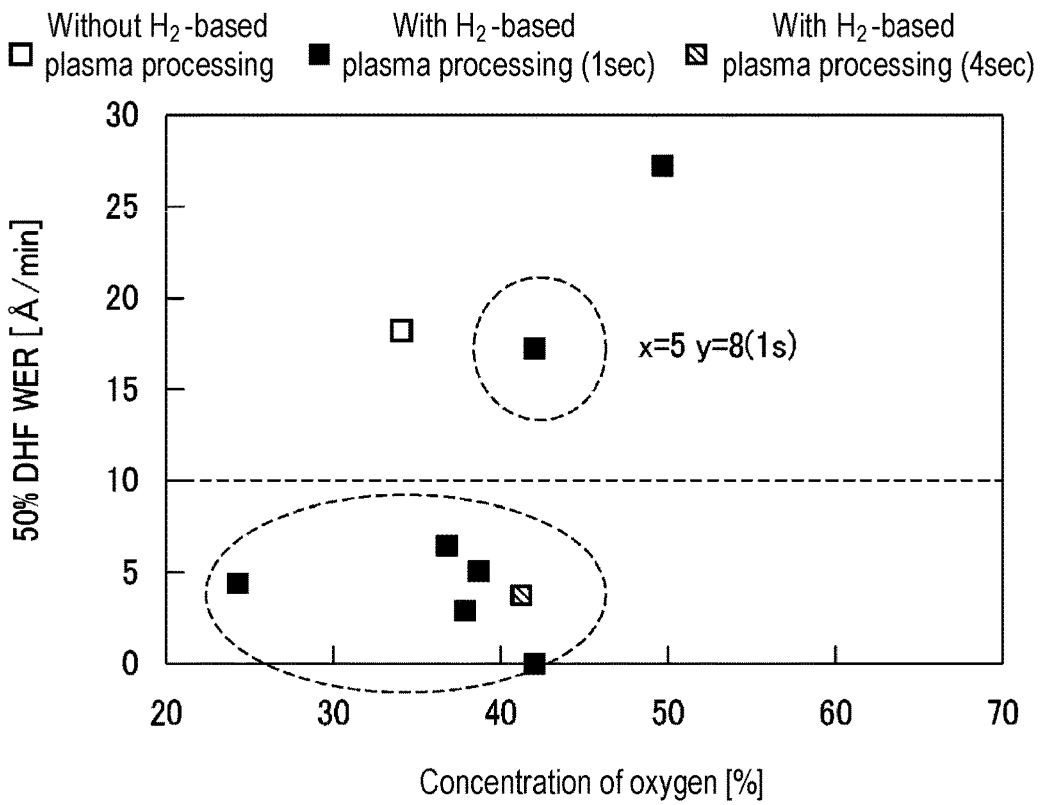
FIG. 13 is an enlarged view of a portion of FIG. 12.

FIG. 12 is a diagram illustrating a relationship between the concentrations of oxygen and WERs for a 50% DHF in SiOC films formed under various conditions. In addition, FIG. 13 is an enlarged view of a portion of FIG. 12. As illustrated in these figures, it was confirmed that by performing the $H_2$-based plasma process, it is possible to decrease the WER for the 50% DHF to 10 Å/min or less when the concentration of oxygen in the film is 42% or less. Even when the $H_2$-based plasma process is performed, the WER becomes a high value of 27 Å/min or more when the concentration of oxygen is 49% or more. In addition, in the case where y is 8 and the frequency of $H_2$-based plasma process is low, when the processing time is 1 sec at x=5 (corresponding to the thickness of the SiC film of 1.6 Å), the WER is as high as 17 Å/min even when the concentration of oxygen is 42%. It is considered that this is because the film was not sufficiently modified due to the low frequency of $H_2$-based plasma process. On the other hand, even when the concentration of oxygen is 42% and y is 8, the WER becomes 10 Å/min or less when the processing time is 4 sec. Although no experiment was conducted at the concentrations of oxygen lower than 26%, it is considered that even if the concentration of oxygen is lower than 26%, up to about 10%, high DHF resistance can be obtained.

Figure 14:
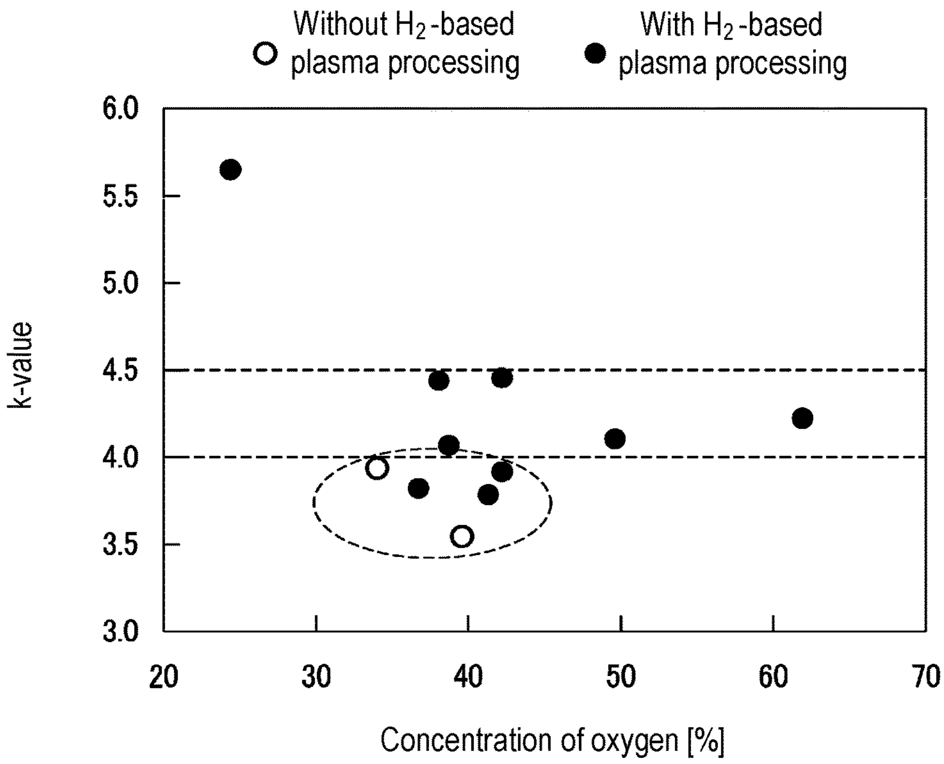
FIG. 14 is a diagram illustrating a relationship between concentrations of oxygen and k-values in SiOC films formed under various conditions.
Figure 15:
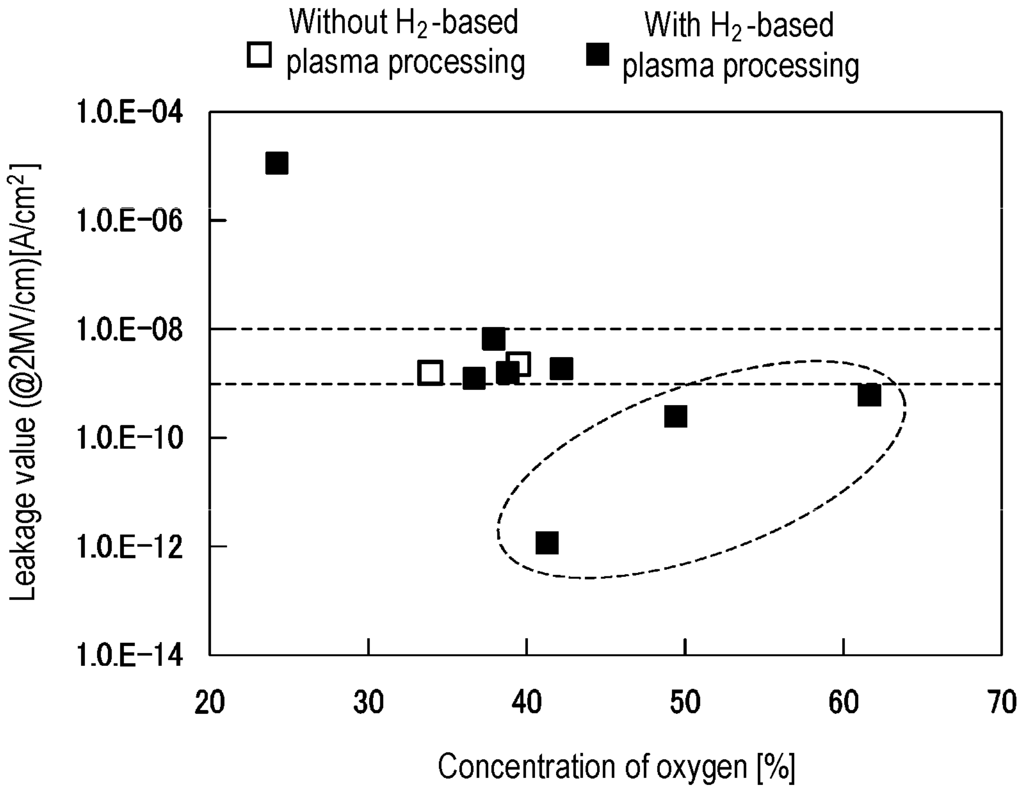
FIG. 15 is a diagram illustrating a relationship between concentrations of oxygen and leakage values in SiOC-based films formed under various conditions.

FIG. 14 is a diagram illustrating a relationship between concentrations of oxygen and k-values in SiOC films formed under the above-mentioned various conditions. FIG. 15 is a diagram illustrating a relationship between concentrations of oxygen and leakage values in SiOC-based films formed under the above-mentioned various conditions. As illustrated in these figures, when the concentrations of oxygen in the SiOC-based films are low, the k-values and the leakage values tend to decrease. Schematically, a preferred k-value of 4.5 or less and a preferred leakage value of $1.0\times10^{-8}$ A/cm$^2$ or less are obtained when the concentrations of oxygen are 34% or more (including the case where the $H_2$-based plasma process is not performed). In addition, when x is fixed at 5 and y is varied from 2 to 8, the k-values are 4.0 or less at the concentrations of oxygen of 35 to 42%. Further, when the concentrations of oxygen are 49% or more, the leakage values are $1.0\times10^{-9}$ A/cm or less, and when the time for the $H_2$-based plasma process is increased to 4 sec at x=5 and y=8, an extremely low leakage property of $1.0\times10^{-12}$ A/cm$^2$ or less can be obtained at the concentration of oxygen of 42%.

<Other Applications>

Although an embodiment has been described above, it is to be considered that the embodiment disclosed herein is exemplary in all respects and is not restrictive. The above-described embodiment may be omitted, replaced, or modified in various forms without departing from the scope and gist of the appended claims.

For example, although an example in which as the carbon-containing gas, which is a carbon precursor, mainly an organic compound gas having an unsaturated carbon bond is used, and as the silicon-containing gas, which is a silicon precursor, a silane-based compound is mainly used has been illustrated in the above-described embodiment, the present disclosure is not limited thereto. In addition, an example in which ALD is mainly used for forming a SiC-based film has been illustrated in the above-described embodiment, the present disclosure is not limited thereto.

In addition, as for the film forming apparatus, various structures may be adopted without being limited to the structure of the film forming apparatus 100 of the above-described embodiment. Further, although an example of using a single-wafer-type film forming apparatus 100 has been illustrated in the above-described embodiment, a batch-type film forming apparatus configured to process a plurality of substrates may be used. As the batch-type film forming apparatus, for example, a vertical apparatus in which a plurality of vertically stacked substrates are loaded into and processed in a reaction tube may be used.

Although an example in which the formation of the SiC-based film, the oxidation process of the SiC-based film, and the $H_2$-based plasma process are all performed inside the chamber 1 of the film forming apparatus 100 has been illustrated in the above-described embodiment, any or all of these may be performed by separate apparatuses. In this case, it is preferable to connect the chamber of each apparatus to a vacuum transfer chamber and to perform the formation of the SiC-based film, the oxidation process of the SiC-based film, and the $H_2$-based plasma process of the SiOC in-situ.

Further, the frequency of oxidation process (the thickness of the SiC-based film before performing the oxidation process) and the frequency of $H_2$ gas plasma process (the thickness of the SiOC-based film before performing the $H_2$-based plasma process) may be constant or may be varied.

Further, although a semiconductor substrate (semiconductor wafer) has been exemplified as the substrate in the above-described embodiments, the substrate is not limited thereto, and any substrate is applicable.

According to the present disclosure, it is possible to provide a film forming method and a film forming apparatus capable of easily forming a SiOC-based film having high controllability of a film composition and film properties, such as a wet etching resistance and electrical properties.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a SiOC-based film, the film forming method comprising:

preparing a substrate;

forming a SiC-based film on the substrate by using a carbon precursor which is trimethylsilyacetylene (TMSA) or [(trimethylsilyl) methyl]acetylene (TMSMA) having a triple bond between carbon atoms as an unsaturated carbon bond and a silicon precursor made of a silicon-containing gas;

forming the SiOC-based film by performing an oxidation process on the SiC-based film on the substrate; and performing a processing with plasma of a gas containing a $H_2$ gas on the SiOC-based film on the substrate, wherein the forming the SiC-based film is performed before the SiC-based film has a first given film thickness, wherein the forming the SiC-based film and the forming the SiOC-based film by the oxidation process are executed once or multiple times before the SiOC-based film has a second given film thickness, wherein an operation of forming the SiOC-based film to have the second given film thickness and the performing the processing with the plasma are executed once or multiple times, wherein a wet etching resistance and a composition of the SiOC-based film are controlled by adjusting the second given film thickness, and wherein the first given thickness of the SiC-based film is below 1.6 Å such that the SiOC-based film formed on the substrate has a leakage value of $1\lambda10^{-8}$ A/cm$^2$ or less when an electric field strength of 2 MV/cm is applied.

2. The film forming method of claim 1, wherein, in the forming the SiC-based film, an organic compound gas is used as the carbon precursor, and a silane-based compound gas is used as the silicon precursor.

3. The film forming method of claim 2, wherein the silane-based compound used as the silicon precursor is disilane.

4. The film forming method of claim 3, wherein the forming the SiC-based film is performed at a temperature of 500 degrees C. or less.

5. The film forming method of claim 1, wherein the SiC-based film is formed by atomic layer deposition in which the carbon precursor and the silicon precursor are sequentially supplied to the substrate.

6. The film forming method of claim 5, wherein a number of cycles during the formation of the SiC-based film by the atomic layer deposition is 5 cycles or less.

7. The film forming method of claim 1, wherein the oxidation process is performed by using a thermal reaction with an oxygen-containing gas or plasma of the oxygen-containing gas.

8. The film forming method of claim 7, wherein the oxygen-containing gas is one selected from a group consisting of an $O_2$ gas, a $H_2O$ gas, an $O_3$ gas, and a $H_2O_2$ gas.

9. The film forming method of claim 1, wherein, in the performing the processing with the plasma of the gas containing the $H_2$ gas, a modification of the SiOC-based film is performed, and a $H_2$ gas alone or a mixed gas of the $H_2$ gas and an inert gas is used as the gas containing the $H_2$ gas.

10. The film forming method of claim 9, wherein the second given film thickness of the SiOC-based film ranges from 0.4 to 18.7 Å.

11. The film forming method of claim 9, wherein, in the performing the processing with the plasma of the gas containing the $H_2$ gas, a degree of the modification of the SiOC-based film is controlled depending on a processing time.

12. The film forming method of claim 1, wherein the forming the SiC-based film, the forming the SiOC-based film by performing the oxidation process on the SiC-based film on the substrate, and the performing the processing with the plasma of the gas containing the $H_2$ gas on the SiOC-based film on the substrate are executed in a same chamber.

13. The film forming method of claim 1, wherein the forming the SiC-based film, the forming the SiOC-based film by performing the oxidation process on the SiC-based film on the substrate, and the performing the processing with the plasma of the gas containing the $H_2$ gas on the SiOC-based film on the substrate are executed at a same temperature.

14. The film forming method of claim 1, wherein the SiOC-based film formed on the substrate has a wet etching rate of 10 Å/min or less with respect to a dilute hydrofluoric acid.

15. The film forming method of claim 1, wherein the SiOC-based film formed on the substrate has a dielectric constant of 4.5 or less.

* * * * *